United States Patent
Bulaga et al.

(10) Patent No.: US 6,229,465 B1
(45) Date of Patent: May 8, 2001

(54) BUILT IN SELF TEST METHOD AND STRUCTURE FOR ANALOG TO DIGITAL CONVERTER

(75) Inventors: Raymond J. Bulaga, Richmond; Brooks A. Cummings, Jericho, both of VT (US); Douglas R. Firth, Ithaca, NY (US); John L. Harris, South Burlington, VT (US); Christina L. Newman, Stowe, VT (US); Donald L. Wheater, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/303,288

(22) Filed: Apr. 30, 1999

(51) Int. Cl.[7] .................................................. H03M 1/10
(52) U.S. Cl. ........................................... 341/120; 341/155
(58) Field of Search .................................... 341/120, 155, 341/144, 118; 710/261

(56) References Cited

U.S. PATENT DOCUMENTS

| | | | |
|---|---|---|---|
| 4,485,372 | * 11/1984 | Holloway | 341/155 |
| 4,970,514 | * 11/1990 | Draxelmayr | 341/120 |
| 5,132,685 | 7/1992 | DeWitt et al. | 341/120 |
| 5,159,688 | * 10/1992 | Matsushima et al. | 710/261 |
| 5,173,906 | 12/1992 | Dreibelbis et al. | 371/22.5 |
| 5,177,621 | 1/1993 | Ohtaki et al. | 358/406 |
| 5,185,607 | 2/1993 | Lyon et al. | 341/120 |
| 5,230,000 | 7/1993 | Mozingo et al. | 371/22.4 |
| 5,301,199 | 4/1994 | Ikenaga et al. | 371/22.5 |
| 5,369,648 | 11/1994 | Nelson | 371/27 |
| 5,389,926 | * 2/1995 | Fukushima | 341/120 |
| 5,431,692 | 7/1995 | Hansen et al. | 607/28 |
| 5,481,471 | 1/1996 | Naglestad et al. | 364/489 |
| 5,519,644 | 5/1996 | Benton | 364/571.01 |
| 5,594,439 | 1/1997 | Swanson | 341/118 |
| 5,594,612 | 1/1997 | Henrion | 341/120 |
| 5,600,322 | * 2/1997 | Garavan | 341/120 |
| 5,659,312 | 8/1997 | Sunter et al. | 341/120 |

* cited by examiner

*Primary Examiner*—Howard L. Williams
*Assistant Examiner*—Jean Bruner Jeanglaude
(74) *Attorney, Agent, or Firm*—William N. HOgg

(57) ABSTRACT

A method and structure for testing an A to D converter containing a plurality of discrete components is provided. The testing methodology includes dividing the circuit into a number of segments of the discrete components (for testing purposes only) with each segment having the same number of discrete components or an unequal but known number of discrete components. The value of the components individually and collectively of each segment is tested and compared with the value of the corresponding components of at least one other segment, and an output signal is generated of the compared value of the segments being tested. Preferably, the components are in a ladder configuration and are either resistors or capacitors. The testing of the components takes place by impressing constant voltage reference signal to at least a portion of one of the segments, sampling and holding this value and then providing a similar reference signal to complementary components of the other of said segments being compared, and comparing the output signal from each of the segments.

27 Claims, 2 Drawing Sheets

BUILT IN SELF TEST METHOD AND STRUCTURE FOR ANALOG TO DIGITAL CONVERTER

This invention relates generally to the testing of analog to digital converters, and more particularly to the use of a built in self test (BIST) structure and method for testing analog to digital converters especially those which are part of a larger principally digital circuit.

BACKGROUND INFORMATION

Electrical circuits on microchips are becoming more complex and are used in many more and more different types of circuits. For example, a circuit which is principally a digital circuit may have an analog component(s) or subcircuit(s) which comprises a part of the circuit. In such case analog signals must be converted to digital signals which means that it must contain an analog to digital (A to D) converter.

Of course, circuits that are formed on chips must be tested. In the past a conventional form of testing has been to apply signals from an external source. This technique however, has several drawbacks. First, and very significantly many of the analog subcircuits do not have external entry points for signals to be applied, and thus testing from external sources becomes difficult when it is desired to test the individual subcircuits as well as the entire circuitry on the chip. Also, when a circuit contains analog circuits and an A to D converter, conventional prior art practice has been to apply analog signals to the analog circuit or to the A to D converter and use the analog signals in a predetermined fashion to test the converter. This presents problems since precisely picking up test points on an analog signal can become difficult and may lead to errors. Thus it is desired to provide an improved test method and circuit or testing A to D converters especially where the A to D converters are contained as subcircuits in larger circuitry, and more particularly when the larger circuitry includes significant amounts of digital circuitry.

SUMMARY OF THE INVENTION

According to the present invention, a method of built in self-testing an analog to digital (A to D) converter containing a plurality of discrete components and the circuitry for such testing is provided. The testing methodology includes dividing the circuit into a number of segments of the discrete components (for testing purposes only) with each segment having the same number of discrete components or an unequal but known number of discrete components. The value of the components individually and collectively of each segment is tested and compared with the value of the corresponding components of at least one other segment, and an output signal is generated of the compared value of the segments being tested. In the preferred embodiment, the components are in a ladder configuration and are either resistors or capacitors.

The testing of the component preferably takes place by impressing constant reference signal (preferably voltage) to at least a portion of one of the segments, sampling and holding this value and then providing a similar reference signal to complementary components of the other of said segments being compared, and comparing the output signal from each segments.

DESCRIPTION OF THE PREFERRED EMBODIMENT(s)

Figure 1:
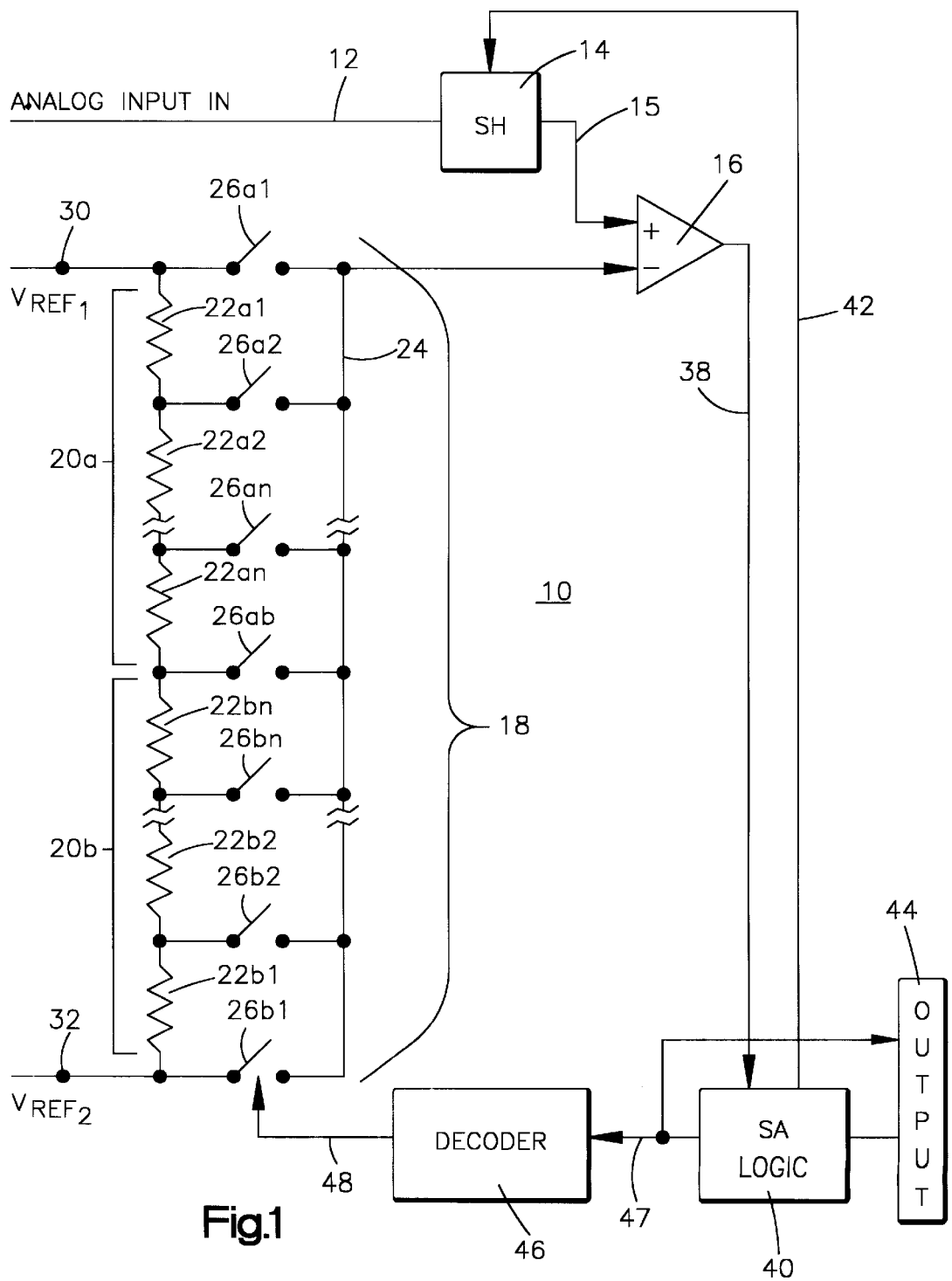
FIG. 1 is a drawing of the circuit components of an analog to digital (A to D) converter.

Referring now to the drawings and for the present to FIG. 1, the circuitry for an analog to digital (A to D) converter is shown. This circuitry is typical of an A to D subcircuit that is embedded in a larger circuit configuration which is comprised chiefly of digital circuits and circuit components, but has an analog input which is required to be converted to a digital signal. Before describing the operation of the built in self test circuitry according to the present invention, it would be helpful to briefly review the operation of the A to D circuit.

As shown in FIG. 1 an A to D converter 10 is provided which includes an analog signal input line 12 connected as input to a memory element which in the preferred embodiment is sample and hold circuitry 14. The sample and hold circuitry 14 provides an output signal on line 15 as one input of a comparison device in the form of a comparator 16. The A to D converter 10 includes a resistance ladder 18, which for test purposes that will be described presently, is divided into two sections, 20a and 20b, each having an equal number of resistors 22. The resistors are designated in section 20a as resistors 22a1–22an and in section 20b as 22b1–22bn. For the purpose of illustration only a few resistors are shown, it being understood however, that many resistors are provided depending on the degree of resolution desired from the analog to digital conversion. The more resistors, the finer the resolution, i.e. the less difference between the various resulting digital signals, and the fewer resistors the coarser the resolution. Indeed, it is not uncommon to have several hundred resistors 22 in the ladder 18.

An analog output line 24 is also provided and is attached to provide a second signal to comparator 16. Switches such as FET's are located in the sections 20a and 20b of the ladder 18 the switches in the section 20a being designated as 26a1–26an and in section 20b as 26b1–26bn; switch 26ab is common to both sections for a purpose which will become evident when the test procedures are described. It is to be understood that these resistors 22 and switches 26 are identical, the designations merely being arbitrary as to the division of the ladder, which is for purpose of testing which will be described presently. The switches 26 can each be opened and closed individually and in desired sequences.

In operation, a reference voltage source 30 designated as VREF1 is provided as input at one end of the resistive ladder 18 which typically may be 3.0 volts and a second reference voltage source VREF2 more negative in voltage potential than VREF1 designated as 32 which typically may be ground is provided as input at the opposite end of the resistive ladder 18. The comparator 16 has an output line 38 which serves as the input to successive approximation logic 40. The successive approximation logic 40 is connected to the sample and hold circuitry 14 by strobe line 42. In addition, the successive approximation logic 40 drives output circuitry 44, and a decoder 46 through lines 47. Decoder 46 is connected through lines shown as 48 to the switches 26a1–26an and 26b1–26bn and 26ab so that each switch 26 can be opened and closed independently.

Circuitry for the sample and hold circuit 14, the successive approximation logic 40, the output 44 and the decoder 46 are all well know in the art of A to D converters. The circuit operates in the following manner.

Analog input is provided to the sample and hold circuit 14 on line 12 in a well known manner. The sample and hold circuit samples the analog input at a given instant in time and impressed the signal on line 15 as one input to the comparator 16. The successive approximation logic 40 provides a signal to the decoder 46 on line 47 and the decoder 46 in turn actuates the switches 26 via lines 48 individually which will vary the value of input signal to the comparator 16 on the line 24 in a well known manner. The successive approximation logic 40 determines the "best fit" for the value on line 15 from the sample and hold circuitry 14 on the line 24 based on the output 38 from the comparator 16. This value is outputted from the successive approximation logic 40 to output 44 as a discrete digital signal value.

Once the best fit has been determined, the successive approximation logic 40 strobes the sample and hold circuit 14 on strobe line 42 to again sample the analog signal on the input line 12. The successive approximation logic 40, again through the decoder 46, activates the switches 26 in order to achieve a "best fit" for this next portion of the analog signal which is then outputted to the output 44 by the successive approximation logic 40. The successive approximation logic 40 continues to repeat this operation which then continues outputting digital representations of the sampled analog input on line 12 as digital code values. As indicated above, in this configuration, normally the reference voltage 30 is at a given value, e.g. 3.0 volts and reference voltage 32 is normally at ground. This provides incremental digital signal outputs ranging from 0.0 volts when switch 26b1 is closed to 3.0 volts with switch 26a1 is closed; and, in this way, the analog input on line 12 is converted to a series of digital signal outputs at output 44.

Conventionally, testing of the circuit is accomplished by providing DC or time varying analog inputs to the A to D circuit, sampling and holding the signals delivered, and stepping the switches 26 through various configurations to determine if the expected digital voltage-out signal, within predetermined limits, is outputted to the output 44. However, as indicated earlier the input on the line 12 often is not accessible to external signals for testing. The present invention is adapted to test the resistors 22 and switches 26 using a BIST having constant voltage inputs rather than requiring an external analog signal input for testing.

Figure 2:
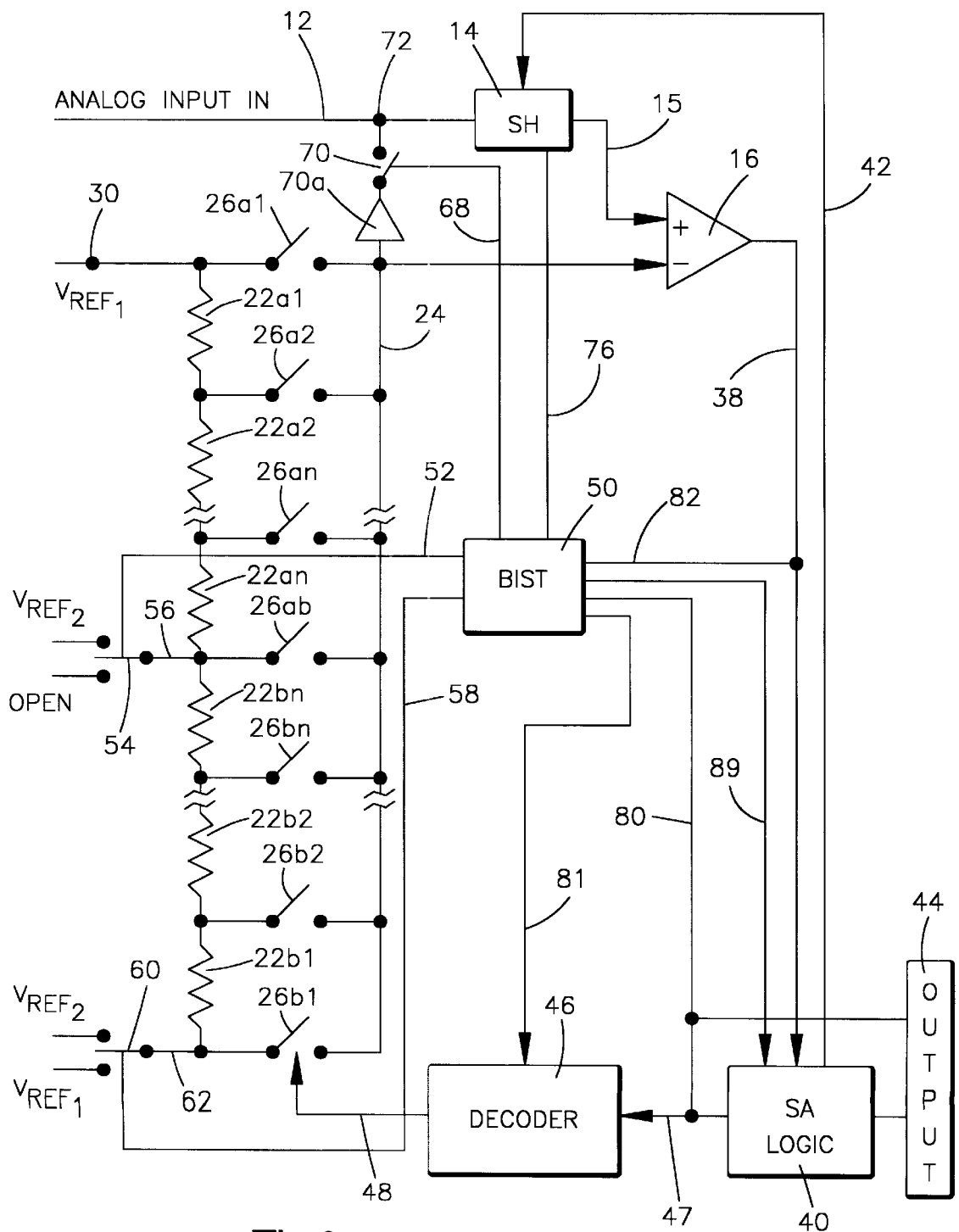
FIG. 2 is a diagram of the circuit of FIG. 1 showing a built in self test (BIST) circuit for testing the A to D circuit of FIG. 1 according to the present invention.

Referring now to FIG. 2, built in self test circuitry 50 is provided which is a conventional state machine to provide the necessary testing and sequence of parameters. Conventional state machines such as those shown in U.S. Pat. Nos. 5,173,906; 4,933,897; 4,965,472; and 4,663,545 can be used which patents are incorporated by reference herein. There is no specific invention being claimed in any state machine per se.

The BIST 50 has a line 52 connecting it to a switch 54 which in turn provides a reference voltage VREF2 or open at line 56 through the switch 54 to a location on the resistance ladder 18 midway between the sections 20a and 20b of the resistance ladder 18 as shown in FIG. 2. The state machine 50 also has line 58 controlling switch 60 which connects to VREF1 or VREF2 through line 62 at the end of the resistance ladder 18 opposite the end where the reference voltage VREF1 30 is connected.

For testing purposes, the voltage at 62 can be switched between the maximum reference value, e.g. 3.0 volts and a minimum value, e.g. ground; and, the voltage at 56 can be switched from the minimum ref value, e.g., 0 volts, and an open condition. State machine 50 is also connected through line 68 to control switch 70 which can selectively connect output buffered by buffer 70a through line 24 to the input line 12 at connection 72. The BIST 50 also has control line 76 connected to the sample and hold circuitry 14 to allow it to cycle; and the successive approximation logic 40 has a line 78 which is an input line to the decoder 46. BIST machine 50 has output lines 81 which can control switches 26 via decoder 46 and line 48. Line 82 connects line 38 to the BIST 50. BIST machine 50 also has input lines 80 to observe the conversion results.

All of the testing is performed by providing input signals of a constant known value rather than by providing time varying analog input signals, the testing being performed in the following manner:

First it should be understood that the reference voltage at 56 and the reference voltage at 62 can each independently be switched between a first given constant level, e.g. 3.0 volts VREF1 and a second constant level VREF2, e.g. ground. With this in mind a first test sequence would be as follows:

In one example test, the voltage ladder is tested for a maximum and minimum value output signal. These tests are referred to as "convert max" and "convert min" respectively. This is done by leaving switch 54 opened and a reference voltage, e.g. 3.0 volts applied at voltage 30, switch 60 connected to the VREF2 position and with reference voltage VREF2 62 at ground. To initiate the test, the switch 70 is closed by the BIST 50 and the switch 26a1 is closed via BIST control line 80a providing an input to the sample and hold circuitry 14 of maximum value, e.g. 3.0 volts. The sample and hold is then strobed by the BIST circuits via line 76 and the resultant voltage supplied to the comparator 16 which in turn would have an output state on line 38 to the successive approximation logic 40. Switch 26a1 is opened and then the successive approximation logic 40 is permitted to search in the normal manner (without restrobing the sample and hold) via line 89 and produce a "converted" digital output at output 44 and RVST 50 via lines 47 and 80. The maximum expected value, e.g. ffff (HEX) is compared with the actual value received via lines 80 by BIST engine 50. This is the "convert max" test.

For the convert MIN test, switch 70 is again closed by BIST. Switch 26b1 is closed via BIST control line 80a which connects the line 24 to ground at reference voltage 62 which is held at ground level for this test. This will provide a value to the sample and hold circuit 14 of a minimum value, e.g. ground or 0, which sample and hold circuit 14 is strobed by the BIST and provides this minimum value to the comparator 16. Switch 26b1 and switch 70 are opened by BIST and successive approximation logic 40 is permitted to cycle and search in the normal manner (without restrobing the sample and hold). The output 44 expects a minimum value, e.g. 0000 (HEX) which is compared to the actual value received by BIST 50 via line 80. This is a "convert min" test.

Another test that can be performed is comparison of segments of the ladder. BIST engine 50 closes switch 54 to connect node 56 to VREF2 typically set to ground and sets switch 60 to connect node 62 to VREF1 which is typically 3.0 volts. The BIST then closes one of the switches (26b1–26bn) and also closes switch 70 to put the voltage corresponding to 5 the switch closed on the input to the sample and hold 14. The sample and hold 14 is then strobed by BIST 50 via line 76. The selected switch 26bx is then opened and switch 70 is opened and the successive approximation logic 40 is permitted to cycle but only using switches 26a1 to 26an. The digital results 78 are examined by BIST 50 for the correct result. This is typically repeated for each switch 26b1 to 26bn.

The same test can also be repeated with the reference voltage 56 at the maximum, e.g. 3.0 volts, with each of the reference voltages 30 and 62 at minimum or ground with proper attention to comparator polarity. After this test sequence has been completed, it can be determined if any of the resistors 22 or switches 26 is defective.

It should be noted that testing of the A to D converter is done entirely with constant input voltages as opposed to requiring any analog signal input. This is accomplished by dividing resistance ladder 18 into equal sections 20a and 20b and testing comparable resistors in groups and individually in each section 20a and 20b against each other to see if their values remain within predetermined tolerances. This obviates the need for any analog input signal.

Also it should be noted that it is not required that the voltage ladder 18 be divided into just two segments although this is an easy way of doing it; the ladder 18 could be divided into any number of equal or unequal but known segments, e.g. 4 segments, with each segment being tested against at least one other segment as a group and individually. This would flag any errors where, in the remote case, the comparable switches or resistors in different segments have identical errors or defects and thus cancel out. In any event the comparison is done with a constant reference signal being applied to more than one section of the resistance ladder, and the output values compared to determine if they are within tolerance.

Several other tests can be performed utilizing this invention. One such test is to check the slew rate of the comparator 16. This test is performed as follows. Switch 26a2 is closed as is switch 70 connecting VREF1 30 to the sample and hold circuit 14 through resistor 22a1 the sample and hold is cycled which applies said value as one input to comparator 16. Switch 70 is then opened and the value of VREF1 is applied to the line 24 also through resistor 22a1 as the other input to comparator 16. Thereafter switch 26b2 is closed then opened and switch 26a2 is then closed again. (i.e. toggling between switches 26a2 and 26b2 while a value is held in the sample and hold circuit 14). This will check the slew rate of the comparator 16 in a well known manner. This test is repeated with other switches, e.g. switches 26a1 and 26b1, 26an and 26bn.

Another test that can be performed is one to test the sensitivity of the comparator. This is performed in the following manner. Switch 26a2 is closed and switch 70 is closed connecting the sample and hold circuit to VREF1 30 through resistor 22a1, the sample and hold is cycled which impresses this value on one input to the comparator 16. Switch 70 is then opened which impresses this same value on the other input to the comparator which will give a compare output. Switch 26a2 is then opened and with the same value remaining in the sample and hold circuit 14 the next adjacent switch to 26a2, e.g. 26a1 is closed and the successive approximation logic 40 determines if the comparator has detected the different value. This test can be performed with each pair of adjacent switches and corresponding resistors.

The above tests check the following condition:

Resistance of each of the resistor in the ladder are comparable to each other (within ½R): This is verified with "Step the Ladder" test.

No switches in ladder stuck open/closed: Stuck Closed verified with Convert Mn Stuck Open done with Step the Ladder A to D converter is able to make conversion: Done with Convert Mn/Ma and Step the Ladder Stew rate of comparator: Done with Slew Rate of Comparator test No stray resistance between switch on ladder and input to comparator: Done with Step the Ladder (would appear as a voltage drop)

Sample & Hold can hold for required period of time: Done with Convert Max and Delays Check Gain in Sample & Hold: Done with step the Ladder (will appear as an incorrect output)

Check Offset in Sample & Hold: Done with Step the Ladder (will appear as an incorrect output)

Check offset to Comparator (assume differential offset on inputs): Done with Step the Ladder (will appear as an incorrect output)

Integral Non-Linerarity (INL): Done with Step the Ladder. Assume worst case INL is at the middle of the ladder. Stepping the Ladder will verify that one half of the ladder is symmetrical (in terms of resistor) to the other half. If this is the case, the net resistance on both halves of the ladder will be the same, thus ensuring the output voltage will be Vref/2.

Differential Non-Linerarity (DNL): Done with Step the Ladder (will appear as an incorrect output; Will miss fault if both resistors compared are off by same amount. DNL could also be covered by splitting the ladder into more or different segments.

No Codes: Done with Step the Ladder (will appear as an incorrect output if code is missing).

Comparator sensitive to one resistor (IR) Done with Sensitivity of Comparator test.

One of the characteristics and advantages of the test circuit of this invention is that it operates independently of the A to D circuit that it tests; i.e. the test circuit is not a part of the A to D circuit. Therefore, a circuit designer may choose to use or not use the test circuit with any A to D circuit that he or she is designing. Thus, if there are other means of testing the A to D circuit, the test circuit can be omitted, leaving room for other circuitry.

Also, current rather than voltage can be used for testing as will be apparent to one skilled in the art.

Accordingly, the preferred embodiments of the present invention have been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A method of testing an analog to digital converter, wherein said converter includes a network of either resistors or capacitors, each individually switchable between "on" and "off" positions, a memory element, a comparison device connected to a sample and hold circuit and to said network, successive approximation logic circuitry, and an output register connected to said successive approximation logic circuitry, said method comprising the steps of:

dividing said network into n number of segments of capacitors or resistors, testing the capacitive or resistive value of each segment against at least one other segment by providing a reference signal of a given value to first and second segments sequentially, storing value of the components of said first segment in the memory element and comparing said stored value to the value of similar components of said second segment with said comparison device, and generating an output of the compared value.

2. The method as defined in claim 1 wherein said test includes testing a given group of components in said one segment with a given group of components in said other segment.

3. The method as defined in claim 1 wherein said test includes testing each capacitor or resistor in said one segment against a comparable component in said other segment.

4. The method as defined in claim 1 wherein said reference signal is a reference voltage.

5. The method as defined in claim 1 wherein said network is a resistive or capacitive ladder.

6. The method as defined in claim 1 wherein said comparison device is a comparator.

7. The method of claim 6 further characterized by testing the SLEW rate of the said comparator by toggling between two components.

8. The method of claim 6 further characterized by testing the sensitivity of the comparator by switching between adjacent components.

9. The method of claim 1 wherein said testing of the analog to digital converter is done with logic circuitry formed independently of the analog to digital converter.

10. A test circuit for testing an analog to digital converter, wherein said converter includes a network of either resistors or capacitors, each individually switchable between "on" and "off" positions, a memory element, a comparison device connected to said memory element and to said network, successive approximation logic circuitry, an output register connected to said successive approximation logic circuitry, said network being divided into n number of segments each segment having a known number of capacitors or resistors, said test circuit comprising:

logic circuitry for testing the capacitive or resistive value of each segment against at least one other segment by providing a reference signal of a given value to first and second segments sequentially, and for storing the value of the components of said first segment in the memory element and for comparing said stored value to the value of similar components of said second segment with said comparison device, and for generating an output of the compared value.

11. The test circuit as defined in claim 10 wherein said test circuitry includes circuitry for testing a given group of components in said one segment with a given group of components in said other segment.

12. The test circuit as defined in claim 10 wherein said test circuitry includes circuitry for testing each capacitor or resistor in said one segment against a comparable component in said other segment.

13. The test circuit as defined in claim 10 wherein said network is a resistive or capacitive ladder.

14. The test circuit as defined in claim 10 wherein said comparison device is a comparator.

15. The test circuit as defined in of claim 14 further characterized by circuitry for testing the SLEW rate of the said comparitor by toggling between two components.

16. The test circuit as defined in claim 14 further characterized by circuitry for testing the sensitivity of the comparator by switching between adjacent components.

17. The test circuit as defined in claim 10 wherein said memory element is a sample and hold circuit.

18. The test circuit as defined in claim 10 wherein said logic circuitry is independent of said analog to digital converter.

19. A method for testing comprising the steps of:
a) providing an analog circuit having a sub-circuit;
b) providing a reference signal to said sub-circuit;
c) operating on said reference signal with a first portion of said sub-circuit to generate a first test signal proportional to the value of the said first portion of said sub-circuit; and
d) using said test signal to compare to a second test signal generated by a second portion of said sub-circuit to test the entire analog circuit.

20. The method of claim 19 wherein the reference signal is constant.

21. The method of claim 19 wherein the sub-circuit is a ladder.

22. The method of claim 19 wherein the ladder is a resistive ladder or a capacitive ladder.

23. The method of claim 19 wherein the entire circuit is A to D converter.

24. The method of claim 19 wherein the reference signal is a voltage.

25. The method of claim 19 wherein the test signal is a voltage.

26. The method of claim 19 wherein the test signal is less than the reference signal.

27. The method of claim 19 wherein the reference signal is a current.

* * * * *